United States Patent [19]
Ikeda

[11] Patent Number: 5,783,815
[45] Date of Patent: Jul. 21, 1998

[54] LIGHT RECEIVING DEVICE HAVING LENS FITTING ELEMENT

[75] Inventor: Shigeo Ikeda, Kanagawa, Japan

[73] Assignee: Sony Corporation, Tokyo, Japan

[21] Appl. No.: 734,021

[22] Filed: Oct. 18, 1996

[30] Foreign Application Priority Data

Oct. 24, 1995 [JP] Japan .................................. 7-300637
Feb. 25, 1996 [JP] Japan .................................. 8-011313

[51] Int. Cl.[6] ............................................. H01J 5/02
[52] U.S. Cl. .......................... 250/208.1; 250/239; 358/483
[58] Field of Search .......................... 250/208.1, 239, 250/216; 358/483

[56] References Cited

U.S. PATENT DOCUMENTS 3,819,272  6/1974  Crozier et al. .................. 250/216
4,581,657  4/1986  Takano ........................... 250/239
4,650,998  3/1987  Martin ........................... 250/239
5,115,125  5/1992  Biggs ............................ 250/239
5,285,062  2/1994  Lee .............................. 250/216

Primary Examiner—Stephone B. Allen
Attorney, Agent, or Firm—Hill & Simpson

[57] ABSTRACT

While the lens fitting member is temporarily bonded on the printed circuit board by a semi-hardening adhesive, the lens fitting member is located so as to adjust the lens to a specific position in relation to the solid-state image sensing element, and the semi-hardening adhesive is then hardened to completely bond the lens fitting member on the printed circuit board, thus reducing the assembly man-hour of a solid-state image sensing device in which a solid-state image sensing element is mounted on a printed circuit board and a lens fitting member with a lens fitted on is provided so as to adjust the lens to a specific position in relation to the solid-state image sensing element.

14 Claims, 8 Drawing Sheets

LIGHT RECEIVING DEVICE HAVING LENS FITTING ELEMENT

BACKGROUND OF THE INVENTION

1. Field of the Invention

The present invention relates to a light receiving device, for example, a solid-state image sensing device, in which a light receiving element, for example, a solid-state image sensing element is mounted on a printed circuit board and a lens fitting member with a lens fitted on is provided so as to locate the lens a specific position in relation to the light receiving element, and the manufacturing method of the same.

2. Description of Related Art

There has been a camera applying a solid-state image sensing element, and the one integrated into a MCM (Multi Chip Module) is shown in FIG. 11 as a related art.

In FIG. 11, a is a printed circuit board, on which a solid-state image sensing element b is mounted. c is a lens holder held by supports d, d, d, d. e is a lens held by the lens holder c. f is a handle, by which operation a focal length can be adjusted (position adjustment in Z direction).

g, g, g, g are screws to fasten the lens holder c on the supports d, d, d, d. Loosening the screws g, g, g, g and shifting the lens holder c in X, Y, and θ direction can locate the lens in X, Y, and θ direction. After completing the location, the screws g, g, g, g are fastened.

In the conventional light receiving device as shown in FIG. 11, since four supports d, d, d, d and screws g, g, g, g are used to assemble the lens holder c (lens fitting member) on the printed circuit board by screwing, the assembly requires a considerable labor.

SUMMARY OF THE INVENTION

The present invention has been made in view of the foregoing problem, and it is an object of the present invention to reduce the man-hour to assemble a light receiving device in which a light receiving element is mounted on a printed circuit board and a lens fitting member with a lens fitted on is provided so as to locate the lens to a specific position in relation to the light receiving element, and it is a further object to protect the light receiving element from dust and moisture.

In order to accomplish the aforementioned object, the manufacturing method of the light receiving device, according to claim 1 of the present invention, is disclosed such that the lens fitting member is temporarily bonded on the printed circuit board by using a semi-hardening adhesive, and in this state, the lens fitting member is located so as to locate the lens to a specific position in relation to the light receiving element, and afterwards, the semi-hardening adhesive is hardened to completely bond the lens fitting member on the printed circuit board.

Therefore, according to the manufacturing method of the light receiving device of claim 1, the assembly does not needs the supports and screws and it can be done very easily so that while the lens fitting member is temporarily bonded on the printed circuit board by using a semi-hardening adhesive, the lens fitting member is located to the printed circuit board, and afterwards, the semi-hardening adhesive is hardened to completely bond the lens fitting member.

The manufacturing method of the light receiving device, according to claim 2 of the present invention, is disclosed such that fitting holes in which the lower parts of the lens fitting member can be pressed are formed in advance on the printed circuit board, the lower parts of the lens fitting member are pressed in the fitting holes, and in this state, the lens is located to a specific position in the optical axis (Z direction) to the light receiving element, and afterwards, the lens fitting member is bonded to the printed circuit board.

Therefore, according to the manufacturing method of the light receiving device of claim 2, the assembly does not need the supports and screws and it can be done very easily so that while the lower parts of the lens fitting member are pressed in the fitting holes, the lens is located to a specific position in relation to the light receiving element, and afterwards, the lens fitting member is bonded to the printed circuit board.

The light receiving device, according to claim 3 of the present invention, is disclosed such that a case is fitted on the printed circuit board with the light receiving element mounted on, which shields an area including the light receiving element from outside and has locating holes, and portions of the lens fitting member are inserted and fitted in the locating holes to locate the lens to a specific position to the light receiving element.

Therefore, according to the light receiving device of claim 3, the assembly can be done very easily so that the lens fitting member is directly fitted on a case inevitably necessary for shielding the light receiving element from outside without using the supports and screws to locate the lens in a specific position to the light receiving element.

The light receiving device, according to claim 7 of the present invention, is disclosed such that an engagement groove surrounding the light receiving element to engage with the lens fitting member is formed on the surface of the printed circuit board for mounting the light receiving element, and a lens-barrel shaped lens fitting member is engaged and fitted in the engagement groove on an end part opposite to the lens fitted thereon.

Therefore, according to the light receiving device of claim 7, only engaging and fitting the lens-barrel shaped lens fitting member in the engagement groove for lens fitting member needs to assemble the lens on the printed circuit board with the light receiving element mounted on, and further, since the lens fitting member is formed in a lens-barrel shape, the lens fitting member can shield the light receiving element from outside; and therefore, it can protect the light receiving element from dust and moisture.

BRIEF DESCRIPTION OF THE DRAWINGS

The present invention will be fully understood from the detailed description given below and from the accompanying drawings of the preferred embodiments of the invention, which, however, should not be taken to limit the specific embodiment, but are for explanation and understanding, in which:

FIG. 4A is a perspective view showing a state before pressing the legs of the lens fitting member into the fitting holes, FIG. 4B is a perspective view showing a state after having pressed the legs of the lens fitting member into the fitting holes. FIG. 4C is a sectional view showing a state after having pressed the legs the same as above, and FIG. 4D is a sectional view showing a state that the legs of the lens fitting member are bonded onto the printed circuit board;

FIG. 6A is a perspective view of the light receiving device, FIG. 6B is a sectional view taken on by the line B—B in FIG. 6A, and FIG. 6C is a sectional view taken on by the line C—C in FIG. 6A;

FIG. 7A is a plan view of the light receiving device, FIG. 7B is a sectional view taken on by the line B—B in FIG. 7A, and FIG. 7C is a sectional view taken on by the line C—C in FIG. 7A;

FIG. 10A is a sectional view, FIG. 10B is another sectional view cut out from another direction, and FIG. 10C is a perspective view in a state that the sealing case is removed.

DESCRIPTION OF THE PREFERRED EMBODIMENTS

Preferred embodiments of the present invention will hereafter be described in detail with reference to the accompanying drawings.

Figure 1:
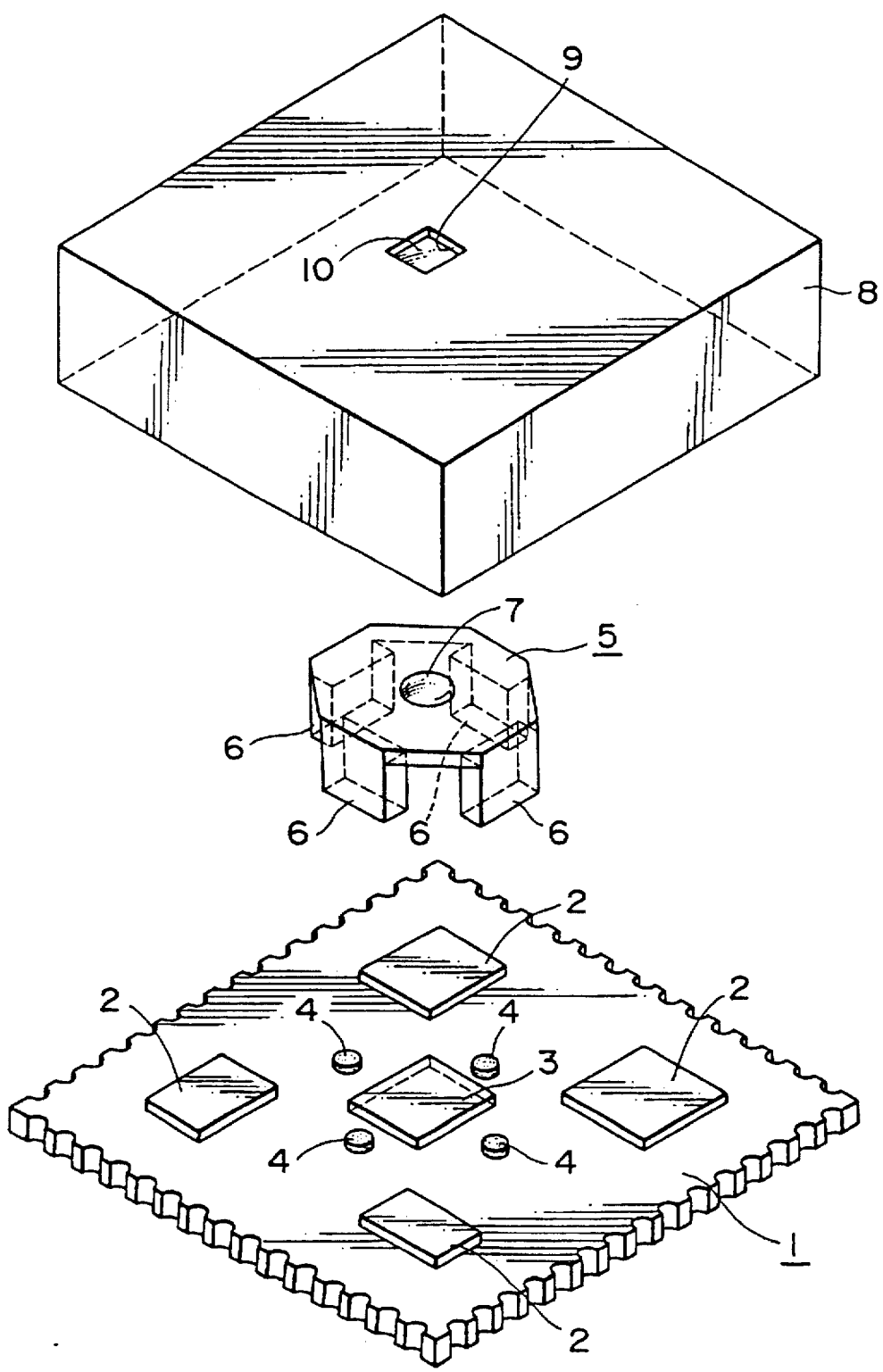
FIG. 1 is an exploded perspective view for explaining the manufacturing method of the light receiving device relating to the first embodiment of the present invention.
Figure 2:
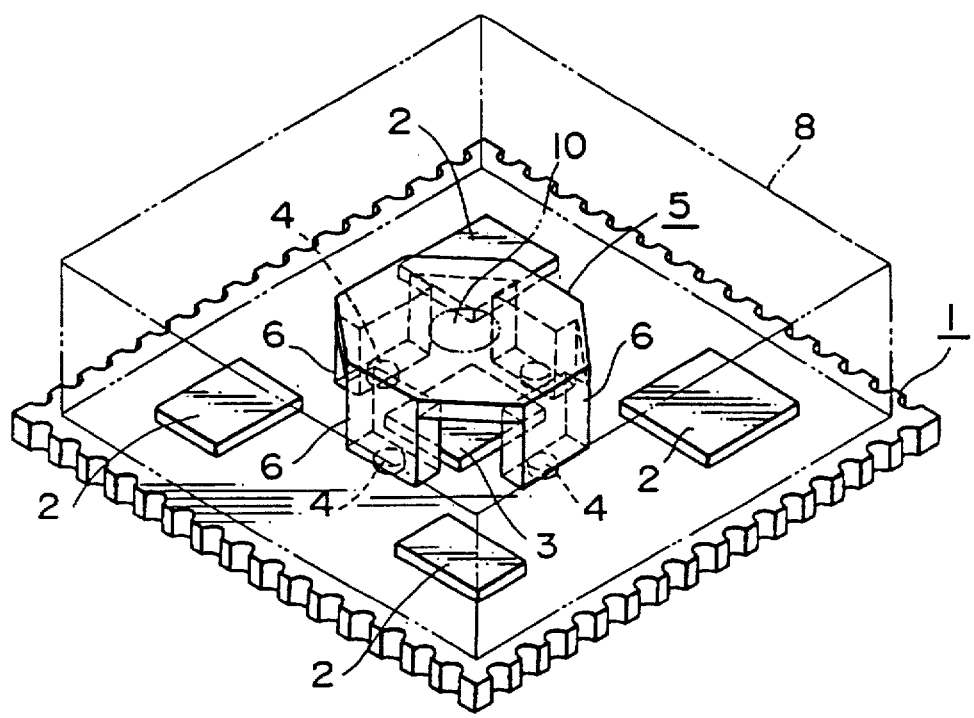
FIG. 2 is a perspective view showing a state of completing the assembly of the light receiving device.

FIG. 1 is an exploded perspective view for explaining the manufacturing method of the solid-state image sensing device relating to the first embodiment of the present invention, and FIG. 2 is a perspective view of the solid-state image sensing device manufactured by the method in FIG. 1.

In the foregoing drawings, 1 is a printed circuit board, 2, 2, 2, 2 are IC chips for solid-state image sensing element drive, signal processing, and the like, 3 is a solid-state image sensing element mounted on the printed circuit board 1. 4 is a semi-hardening adhesive (for example, ultraviolet hardening resin NUV-20 [Nippon Rex Co. Ltd.]) for bonding a lens fitting member 5 described below on the printed circuit board 1, and a liquid adhesive as having a high viscosity about 600 P and a structural coefficient of viscosity about 6.0, and it has a high plasticity before hardening by ultraviolet rays.

5 is the lens fitting member, and it has fitting legs 6, 6, 6, 6 and a lens 7 provided on the center. The lens 7 is made of a transparent resin, and the other part of the lens fitting member except for the lens 7 is made of a colored, for example, a black resin. That is, the lens fitting member is formed by means of the dichromatic molding.

8 is a case fixed on the printed circuit board 1 so as to shield the foregoing IC chips 2, 2, 2, 2 and the solid-state image sensing element 3 from outside. 9 is a light receiving window provided on the case 8 in a position above the solid-state image sensing element 3, and 10 is a sealing glass to cover the light receiving window 9 inside of the case 8 or a filter to cut off the infrared rays and the like.

In this manufacturing method, the semi-hardening adhesives 4, 4, 4, 4 are dropped on appropriate positions on the printed circuit board on which the foregoing IC 2, 2, 2, 2 and the solid-state image sensing element 3 are mounted, on which the fitting legs 6, 6, 6, 6 of the lens fitting member 5 are bonded.

And, the fitting legs 6, 6, 6, 6 of the lens fitting member 5 are placed on the semi-hardening adhesives 4, 4, 4, 4, and in this state, the lens fitting member is located so as to locate the lens 7 to a specific position in relation to the solid-state image sensing element 3. This location is done as to the direction X, Y, θ, and Z (optical axis), using a location adjustment apparatus comprising an image recognition camera and a robot.

And afterwards, the ultraviolet rays are irradiated on the semi-hardening adhesives 4, 4, 4, 4 to harden, and the lens fitting member 5 having been located is bonded on the printed circuit board 1 to gain a permanently maintained position.

Afterwards, the case 8 is bonded to the printed circuit board 1, and the solid-state image sensing device is completed as shown in FIG. 2.

Figure 11:
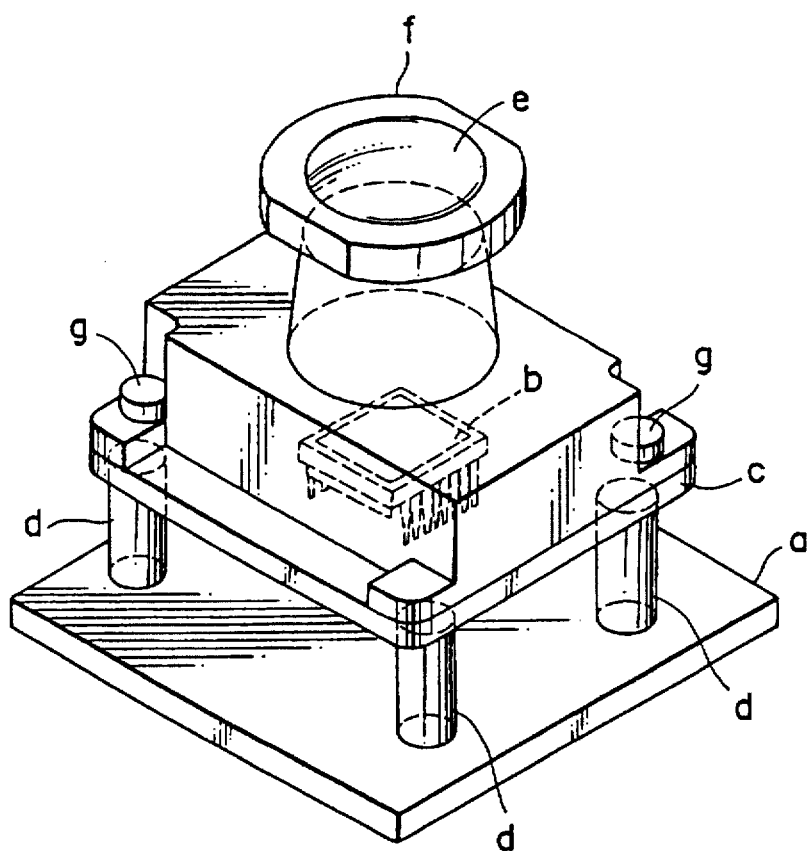
FIG. 11 is a perspective view showing a related art.

According to the foregoing manufacturing method of the solid-state image sensing device, which is different from the method of the solid-state image sensing device using the supports and screws as shown in FIG. 11; in the state that the lens fitting member 5 is temporarily bonded on the printed circuit board 1 by using the semi-hardening adhesives 4, 4, 4, 4, the lens fitting member 5 is located to the printed circuit board 1, and afterwards, the semi-hardening adhesives 4, 4, 4, 4 are hardened by the ultraviolet rays to completely bond the lens fitting member 5; and therefore, the assembly can be done very easily.

Figure 3A:
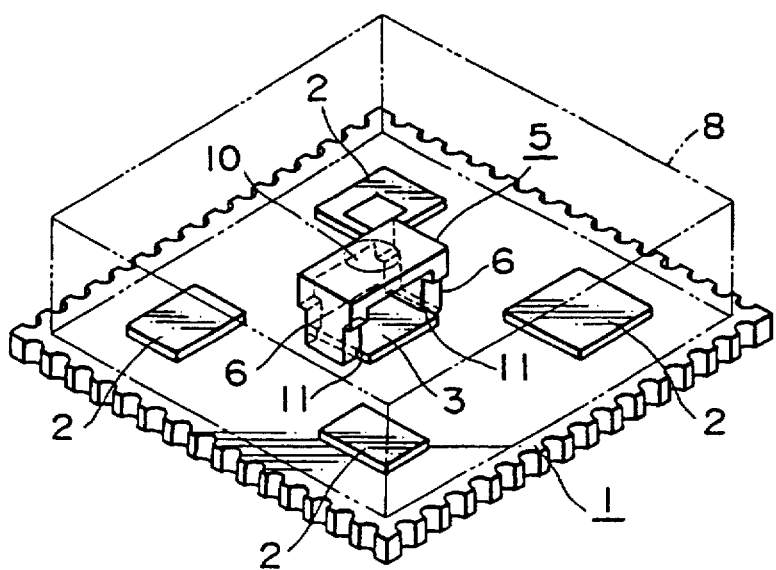
FIG. 3A is a perspective view for explaining the manufacturing method of the light receiving device relating to the second embodiment of the present invention.
Figure 3B:
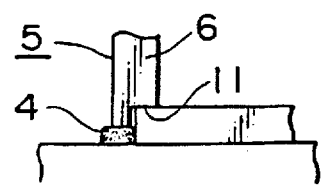
FIG. 3B is the major part of the same.

FIGS. 3A and 3B are drawings to explain the manufacturing method of the solid-state image sensing device relating to the second embodiment of the present invention, and FIG. 3A is a perspective view and FIG. 3B is the major part of the same.

In this embodiment, the location adjustment is done without using the location adjustment apparatus comprising an image recognition camera and a robot. The location adjustment in the optical axis requiring a high accuracy compared to the location adjustment in the X, Y, and θ direction, that is, the focus adjustment (accuracy requirement, for example, within ±100 μm) is done in such a manner that stepped parts 11, 11 for adjusting the focus provided in advance on the lower end surfaces of the legs 6, 6 (only two legs are provided in this embodiment) of the lens fitting member 5 are brought into contact with the surface of the solid-state image sensing element 3. This point distinguishes this embodiment from the first.

Namely, the lens fitting member 5 is set such that the space between the lens 7 and the stepped parts 11, 11 of the legs 6, 6 is coincident with the distance between the lens 7 and the solid-state image sensing element 3, and placing the stepped parts 11, 11 on the surface of the solid-state image sensing element 3 will automatically adjust the focus as shown in FIG. 3B.

This method can locate the position of the lens fitting member 5 to the printed circuit board 1 without using such an expensive location adjustment apparatus. However, the stepped parts 11, 11 of the lens fitting member 5 can rub the surface of the solid-state image sensing element 3, and a part of the semi-hardening adhesive 4, 4, 4, 4 can reach the surface of the solid-state image sensing element 3 passing through a space between each of the stepped parts 11, 11, 11, 11 and the solid-state image sensing element 3 with a slight possibility to stain the surface. Therefore, this method needs a precaution to the adhesive passing through.

Further, without providing the stepped parts 11, 11 on the legs 6, 6 of the lens fitting member 5, the construction may be formed such that bringing the lower end surfaces of the legs 6, 6 into contact with the surface of the solid-state image sensing element 3 will automatically adjust the focus position of the lens 7 on the lens fitting member 5 to the solid-state image sensing element 3.

Figure 4A:
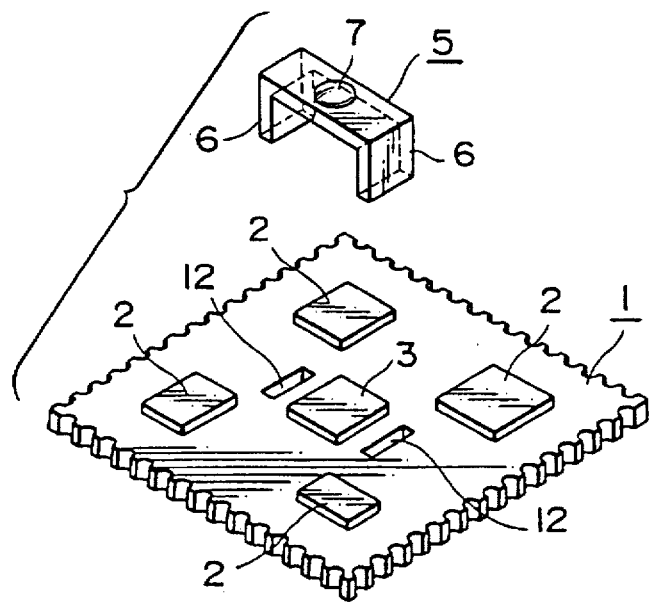
FIGS. 4A to 4D are the drawings for explaining the manufacturing method of the light receiving device relating to the third embodiment of the present invention.
Figure 4C:
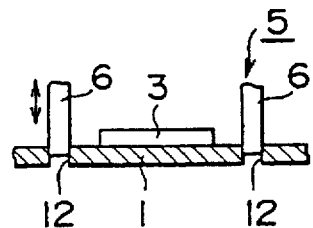
Figure 4B:
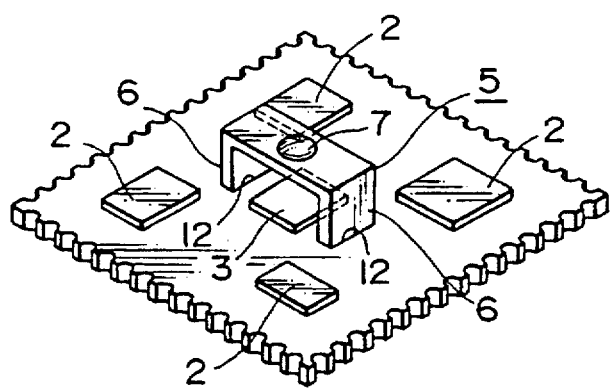
Figure 4D:
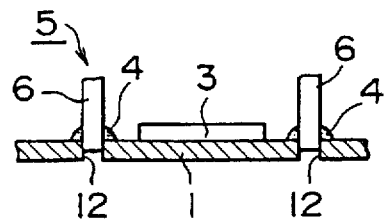

FIGS. 4A to 4D are the drawings for explaining the manufacturing method of the solid-state image sensing device relating to the third embodiment of the present invention. FIG. 4A is a perspective view showing a state before pressing the legs of the lens fitting member into the fitting holes, FIG. 4B is a perspective view showing a state after having pressed the legs of the lens fitting member into the fitting holes, FIG. 4C is a sectional view showing a state after having pressed the legs the same as above, and FIG. 4D is a sectional view showing a state that the legs of the lens fitting member are bonded onto the printed circuit board.

In this embodiment, as shown in FIG. 4A, the printed circuit board 1 has fitting holes 12, 12 into which the legs 6, 6 of the lens fitting member 5 (in this case, only two legs are provided the same as the second embodiment) are pressed, and in this state, the focus adjustment is performed using the location adjustment apparatus comprising the image recognition camera and robot machine.

That is, the focus adjustment is done such that the robot machine lowers the lens fitting member 5 on the basis of an image recognition result by the camera (namely, focus detection result), as shown in FIG. 4C. Therefore, the press-fit amount is needed to be set somewhat below. Further, the location adjustment in the direction X, Y, and θ can automatically be done through pressing the legs 6, 6 into the fitting holes 12, 12.

After completing the focus adjustment, the legs 6, 6 of the lens fitting member 5 are bonded using the adhesive 4, as shown in FIG. 4D. Afterwards, just the same as the other embodiments, a case not illustrated is bonded on the printed circuit board 1.

According to this manufacturing method of the solid-state image sensing device, which is different from the method of the solid-state image sensing device using the supports and screws as shown in FIG. 11; in the state that the lower parts of the legs 6, 6 of the lens fitting member 5 are pressed into the fitting holes 12, 12, the lens fitting member 5 is located so as to locate the lens 7 to a specific position in regard to the solid-state image sensing element 3, and afterwards, the lens fitting member 5 is bonded on the printed circuit board 1; and therefore, the assembly can be done very easily. And, the semi-hardening adhesive 4 may or may not be used; in the regard that the semi-hardening adhesive may not be used, this embodiment is different from the third embodiment.

Figure 5:
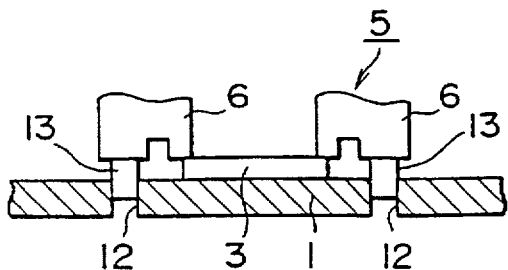
FIG. 5 is a sectional view for explaining the manufacturing method of the light receiving device relating to the fourth embodiment of the present invention.

FIG. 5 is a sectional view for explaining the manufacturing method of the solid-state image sensing device relating to the fourth embodiment of the present invention.

As shown in FIG. 5, this embodiment is provided with pins 13, 13 to be pressed into the fitting holes 12, 12. The focus is adjusted such that the pins 13, 13 are pressed by lowering the lens fitting member 5 until the lower end surfaces of the legs 6, 6 of the lens fitting member 5 come into contact with the surface of the solid-state image sensing element 3. After the focus adjustment, the pins 13, 13 are bonded on the printed circuit board 1 and further bonded on the legs 6, 6 of the lens fitting member 5.

The present invention includes this type of embodiment.

Figure 6A:
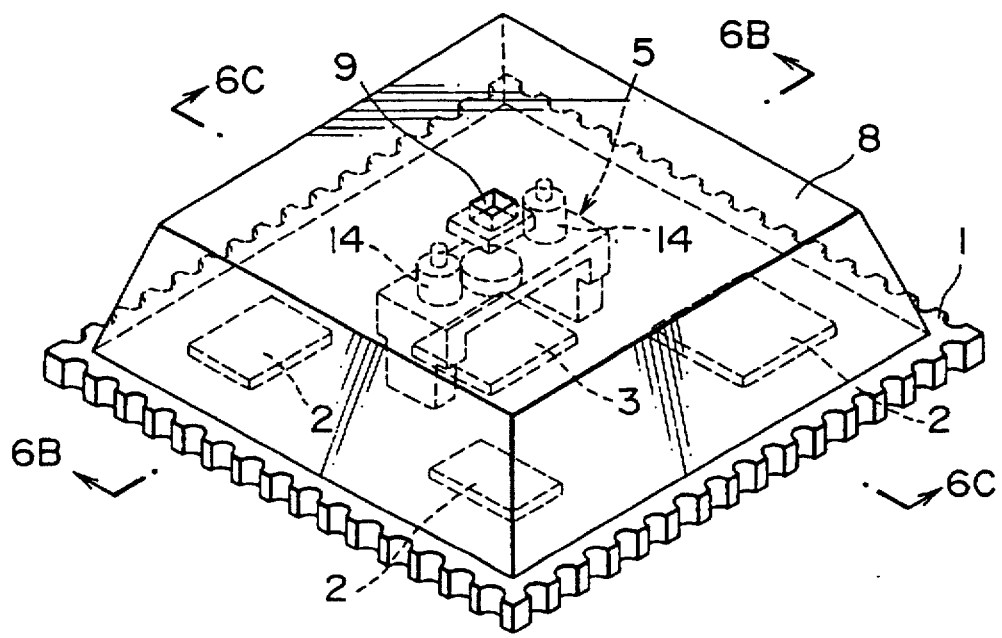
FIGS. 6A to 6C are the drawings for explaining the manufacturing method of the light receiving device relating to the fifth embodiment of the present invention.
Figure 6B:
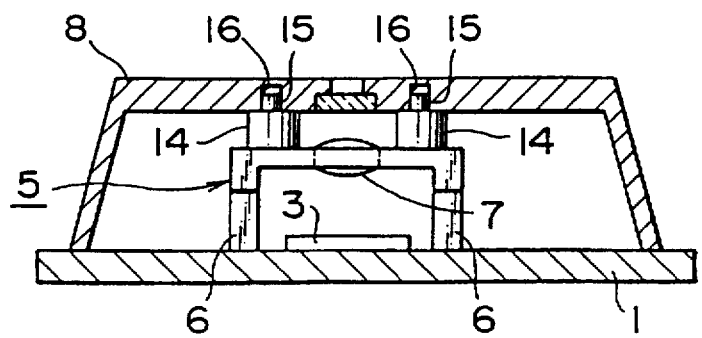
Figure 6C:
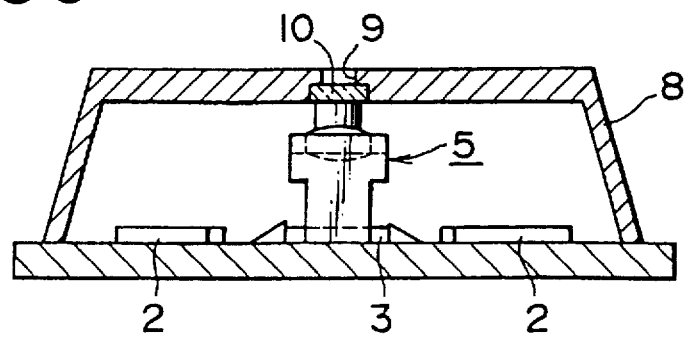

FIGS. 6A to 6C are the drawings for explaining the manufacturing method of the solid-state image sensing device relating to the fifth embodiment of the present invention, FIG. 6A is a perspective view, FIG. 6B is a sectional view taken on by the line B—B in FIG. 6A, and FIG. 6C is a sectional view taken on by the line C—C in FIG. 6A.

In this solid-state image sensing device, the lens fitting member 5 is fitted onto a sealing case 8 fixed on the printed circuit board 1. That is, in all the foregoing solid-state image sensing device, the lens fitting member 5 is fitted to the printed circuit board 1; however, in this solid-state image sensing device, fitting the lens fitting member 5 onto the sealing case 8 locates the lens 7 of the lens fitting member 5 to the solid-state image sensing element 3 mounted on the printed circuit board 1.

Concretely, the lens fitting member 5 has engagement pieces 15, 15 on the upper surfaces of upward fitting pieces 14, 14, on the other hand, the sealing case 8 has locating holes 16, 16 engaging with the engagement pieces 15, 15 on the ceiling. The foregoing engagement pieces 15, 15 are engaged into the locating holes 16, 16 of the sealing case 8 and bonded. Afterwards, fitting the case 8 in a specific position on the printed circuit board 1 will automatically locate the lens 7 to the solid-state image sensing element 3 in the direction X, Y, θ, and Z, and the solid-state image sensing device is completed. Although the size of the beam limiting window 9 (light receiving window) depends on the dimensional accuracy of the case 8, it can be made considerably large and the location accuracy can be enhanced.

This solid-state image sensing device which is different from the conventional solid-state image sensing device using the supports and screws as shown in FIG. 11 can easily be assembled simply by: fitting the lens fitting member 5 onto the sealing case 8, engaging the engagement pieces 15, 15 into the locating holes 16, 16 and bonding them, and bonding the sealing case 8 on the printed circuit board 1.

Figure 7A:
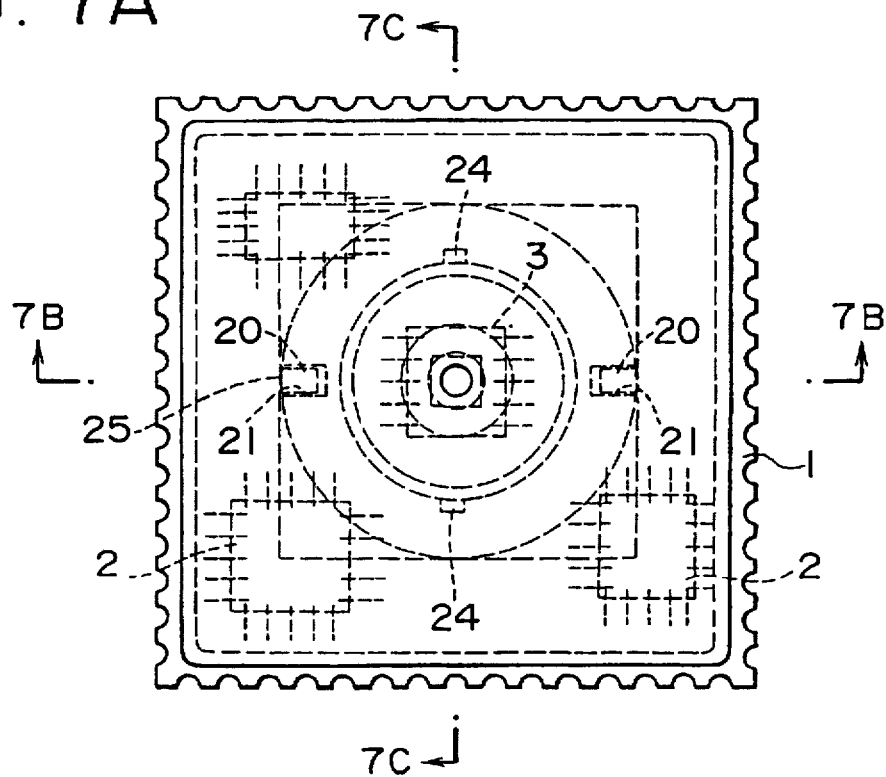
FIGS. 7A to 7C are the drawings showing the light receiving device relating to the sixth embodiment of the present invention.
Figure 7B:
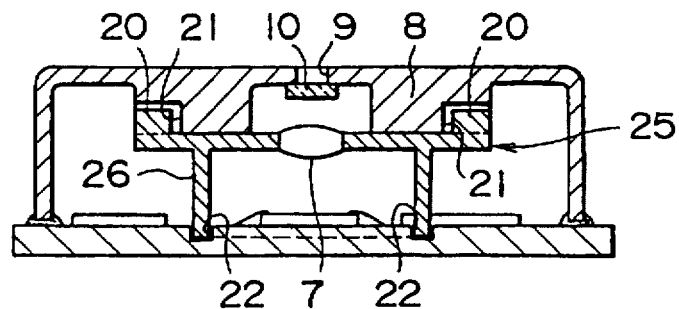
Figure 7C:
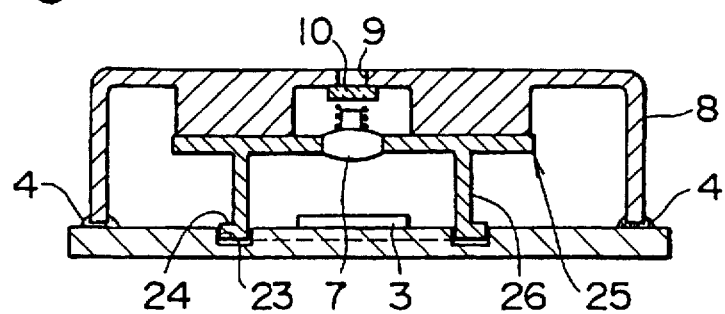
Figure 8:
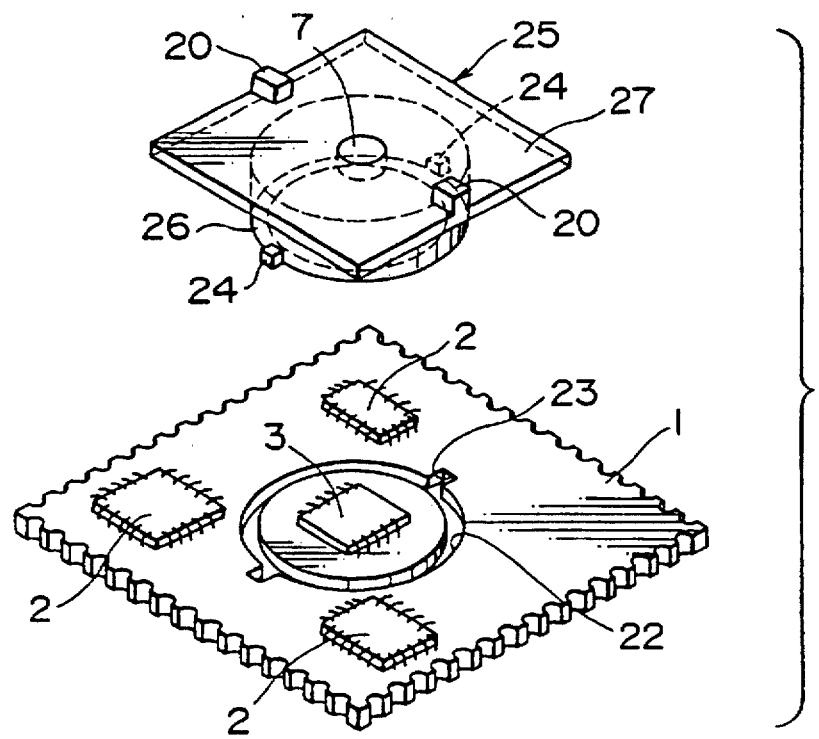
FIG. 8 is an exploded perspective view in a state that the sealing case for the light receiving device relating to the foregoing sixth embodiment is removed.

FIGS. 7 and 8 are the drawings showing the solid-state image sensing device relating to the sixth embodiment of the present invention, FIG. 7A is a plan view of the solid-state image sensing device, FIG. 7B is a sectional view taken on by the line B—B in FIG. 7A, and FIG. 7C is a sectional view taken on by the line C—C in FIG. 7A; FIG. 8 is an exploded perspective view in a state that the sealing case is removed.

Although this solid-state image sensing device has many points in common with the solid-state image sensing device shown in FIG. 6, the fundamental difference lies in that it has a lens fitting member formed in a lens-barrel shape and a lens-barrel shaped lens fitting member 25 is engaged to fit in a lens fitting member engagement groove 22 formed so as to surround the solid-state image sensing element 3 mounted on the printed circuit board 1.

The lens fitting member 25 is integrated with the lens 7 on the upper center or is integrally made therewith, and has locating projections 20, 20 on the top periphery. On the other hand, the sealing case 8 is provided with locating recesses 21, 21 for engaging with the projections 20, 20. The engagement of the locating projections 20, 20 with the locating recesses 21, 21 specifies the position of the lens 7 to the sealing case 8.

A circular engagement groove 22 with which the front of a cylindrical part 26 of the foregoing lens fitting member 25 engages is formed so as to surround the solid-state image sensing element 3 mounted on the surface of the printed circuit board 1. The printed circuit board 1 is made of plural layers. Connecting leads of the first layer for bonding electrodes of the solid-state image sensing element 3 and other IC chips 2, 2, 2 are formed on the outermost surface of the printed circuit board 1. The wirings for the second layer and under are formed in an area deeper than the depth (for example, several tens to several hundreds of micrometers) of the engagement groove 22 for the lens fitting member 25. The electric connections between the first and second layer are made by means of through holes. Therefore, the electric connections between the solid-state image sensing element 3 surrounded by the engagement groove 22 and the components outside the engagement groove 22 such as IC chips 2 have to be made by means of the through holes.

Locating recesses 23, 23 are formed outside (or inside) the engagement groove 22 for the lens fitting member 25. On the other hand, locating projections 24, 24 are formed on the outer (or inner) surface of the front of the cylindrical part 26 of the lens fitting member 25. Fitting the front of the cylindrical part 26 of the lens fitting member 25 into the engagement groove 22 so as to fit the projections 24, 24 into the locating recesses 23, 23 will fit the lens 7 into the printed circuit board 1. This fitting is fixed by adhesives 4 applied in the groove 22 in advance.

According to this solid-state image sensing device, simply fitting the lens fitting member 25 into the groove 22 can easily assemble it on the printed circuit board 1, moreover, since the lens fitting member 25 is formed in a lens-barrel shape, the solid-state image sensing element 3 on the printed circuit board 1 is sealed with the lens fitting member 25 when the lens fitting member 25 is fit on the printed circuit board 1. Therefore, the lens fitting member 25 can prevent dust and moisture from staining the solid-state image sensing element 3.

As dust or moisture lies on the surface of the solid-state image sensing element 3, it becomes defective, and the solid-state image sensing element 3 is protected by the sealing case 8. However, the solid-state image sensing element 3 is not protected before the sealing case 8 being fitted; and therefore, it is very difficult to completely reject dust and moisture before sealing. According to this solid-state image sensing device, since the solid-state image sensing element 3 can be sealed at the lens fitting process before the sealing case 8 is fitted in, the defective due to dust and moisture can sufficiently be reduced compared to the conventional.

Furthermore, in contrast to the solid-state image sensing device shown in FIGS. 1 to 6, this solid-state image sensing device has a lens-barrel shaped lens fitting member 25; and therefore, the lens fitting member 25 is difficult to fall down during the assembly, facilitating a still more smooth work.

Figure 9:
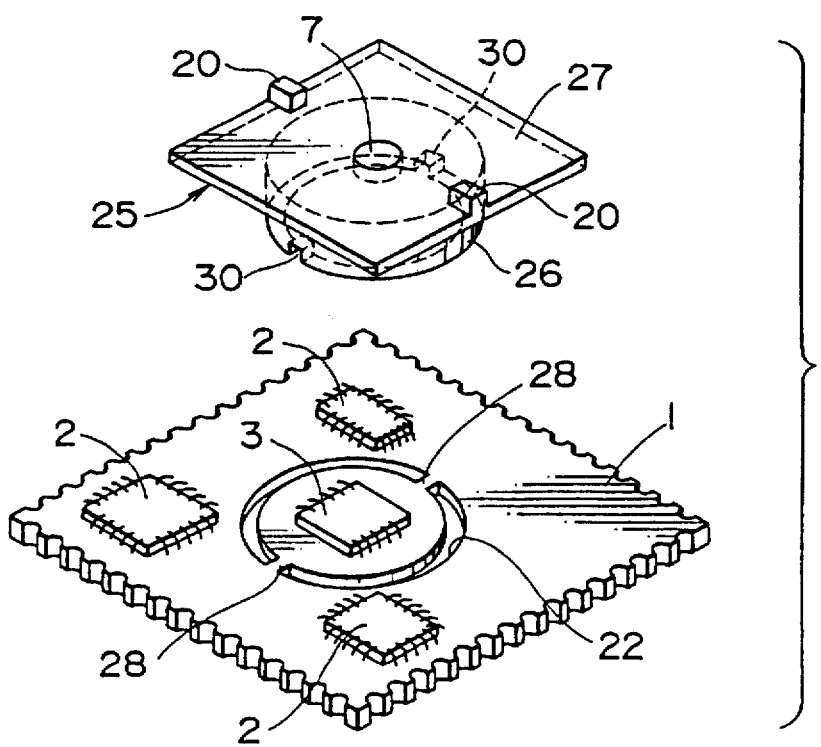
FIG. 9 is an exploded perspective view in a state that the sealing case for the light receiving device relating to the modified embodiments shown in FIG. 7 and 8 is removed.

FIG. 9 is an exploded perspective view in a state that the sealing case for the solid-state image sensing device relating to the modified embodiments shown in FIGS. 7 and 8 is removed.

This solid-state image sensing device has discontinuities 28, 28 for passing wirings across the engagement groove 22, which is different from the solid-state image sensing device in FIGS. 7 and 8. In correspondence with this, engagement recesses 30, 30 for engaging with the discontinuities 28, 28 are formed on the front of the cylindrical part 26 of the lens-barrel shaped lens fitting member 25. Engaging the cylindrical part 26 of the lens-barrel shaped lens fitting member 25 into the engagement groove 22 so as to fit the foregoing discontinuities 28, 28 into the engagement recesses 30, 30 will locate the lens in the X, Y, and θ direction. Further, the fitting and fixing work is the same as the one in the embodiment shown in FIG. 7 and 8, however in this embodiment, it is possible to fill adhesives in the gaps between the discontinuities 28, 28 of the foregoing engagement groove 22 for the lens fitting member and the engagement recesses 30, 30. This ensures sealing effect, which is preferable.

In this solid-state image sensing device, the electrical connections between the solid-state image sensing element 3 and the components (IC chips 2, 2, 2) outside the engagement groove 22 for the lens fitting member are made by the wirings formed on the discontinuities 28, 28 of the foregoing engagement groove 22 for the lens fitting member.

According to this construction, it is not necessary to form a wiring layer in a deep area of the printed circuit board 1, more concretely, in an area deeper than the depth of the engagement groove 22 for the lens fitting member.

Figure 10A:
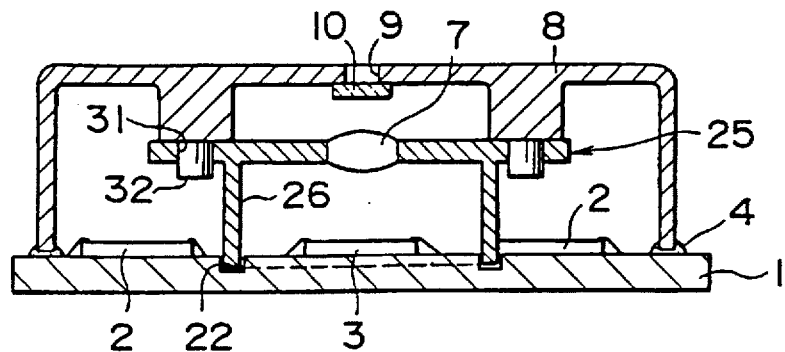
FIGS. 10A to 10C shows the other modified embodiments of the light receiving device.
Figure 10B:
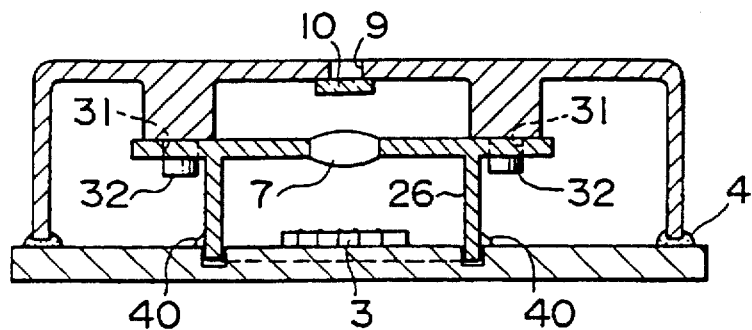
Figure 10C:
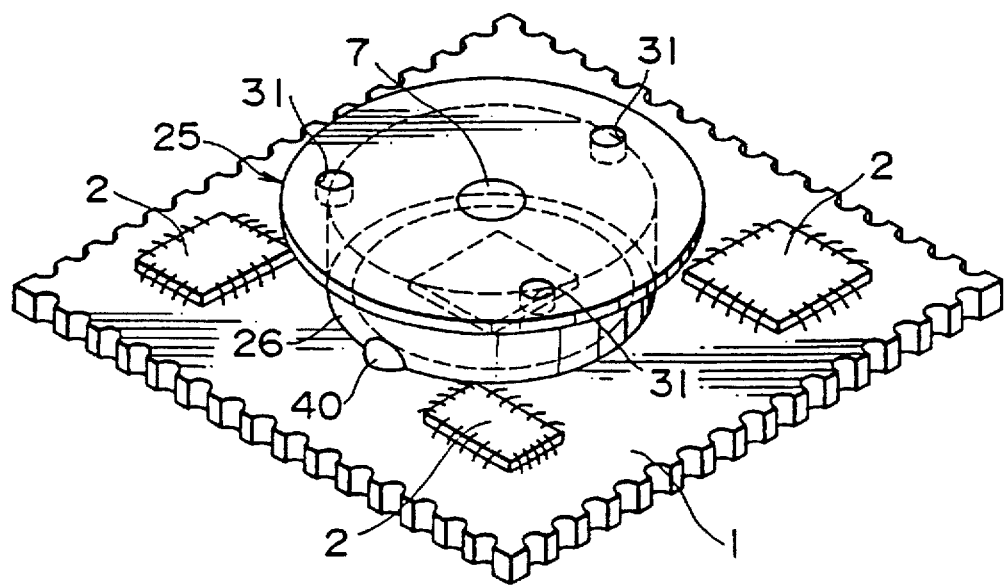

FIGS. 10A to 10C show the other modified embodiments of the light receiving device. FIG. 10A is a sectional view, FIG. 10B is another sectional view cut out from another direction, and FIG. 10C is a perspective view in a state that the sealing case is removed.

In this modified embodiment, locating holes 31, 31 are provided on the upper part of the lens fitting member 25, locating projections 32, 32 for engaging with the holes 31, 31 are provided on the sealing case 8. And, fitting the locating projections 32, 32 into the foregoing locating holes 31, 31 will specify the position of the lens 7 to the sealing case 8.

Furthermore, in all embodiments except for the first, the part such as the legs 6 or the cylindrical part 26 of the lens fitting member 5, 25 excluding the lens 7 is preferably made of a resin not having light transmittivity and light reflectivity, for example, a black resin, by means of the dichromatic molding in a different color from that of the lens. This is to prevent flare of light; leading to enhancing resolution and contrast, preventing smear, color shade, and defective images to improve image quality. Instead of the dichromatic molding, simply frosting only the inner surface of the legs 6 or the cylindrical part 26 or coloring it in black may be another solution.

As described above, the present invention can be applied in various embodiments.

According to the manufacturing method of the light receiving device of claim 1, in the state that the lens fitting member is temporarily bonded on the print circuit board by using the semi-hardening adhesives, the lens fitting member is located to the printed circuit board without using the supports and screws, and afterwards, the semi-hardening adhesives are hardened by the ultraviolet rays to completely bond the lens fitting member; therefore, the assembly can be done very easily.

According to the manufacturing method of the light receiving device of claim 2, in the state that the lower parts of the lens fitting member are pressed into the fitting holes, the lens fitting member is located without using the supports and screws so as to locate the lens to a specific position in regard to the light receiving element, and afterwards, the lens fitting member is bonded on the printed circuit board; therefore, the assembly can be done very easily.

According to the light receiving device of claim 3, fitting the lens fitting member directly onto the sealing case inevitably necessary for shielding the light receiving element from outside without using the supports and screws will locate the lens to a specific position in regard to the light receiving element; therefore, the assembly can be done very easily.

According to the light receiving device of claim 7, simply fitting the lens-barrel shaped lens fitting member into the groove can easily assemble the lens on the printed circuit board on which the light receiving element is mounted, moreover, since the lens fitting member is formed in a lens-barrel shape, the lens fitting member can shield the light receiving element from outside. Therefore, the light receiving element can be protected from dust and moisture, at the fitting stage of the lens before the sealing case is fitted on.

While specific embodiments of the present invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. A light receiving device, wherein a light receiving element is mounted on a printed circuit board; a case is fitted which shields an area having said light receiving element mounted on said printed circuit board from outside and has locating holes for a lens fitting member; and portions of said lens fitting member with said lens fitted on are inserted and fitted in the locating holes of said case for said lens fitting member, and the lens is located to a specific position in relation to said light receiving element.

2. A light receiving device as claimed in claim 1, wherein said light receiving element is a solid-state image sensing element.

3. An image sensing device, wherein elements of a peripheral circuit are mounted on the same printed circuit board as the light receiving element as claimed in claim 1 is mounted.

4. An image sensing device as claimed in claim 3, wherein said peripheral circuit comprises a light receiving element driver and a signal processor.

5. A light receiving device, wherein:

a light receiving element is mounted on a printed circuit board;

an engagement groove for engaging with a lens-barrel shaped lens fitting member is formed so as to surround an area in which said light receiving element is mounted on a surface of said printed circuit board; and an end opposite to a lens fitted on the lens fitting member is engaged and fixed in the engagement groove.

6. A light receiving device as claimed in claim 5, wherein said light receiving element is a solid-state image sensing element.

7. A light receiving device as claimed in claim 5, wherein:

one or more locating projections are formed on an inner or outer surface of an end opposite to a lens on the lens-barrel shaped lens fitting member; and one or more locating recesses for engaging with said locating projections are formed on an inner or outer surface of the engagement groove for the lens fitting member.

8. An image sensing device, wherein:

a light receiving element is mounted on a printed circuit board;

lens fitting member fitting holes are formed on an area on said printed circuit board where said light receiving element is mounted; and an end opposite to a lens fitted on the lens fitting member is inserted and fixed in said lens fitting member fitting holes.

9. An image sensing device as claimed in claim 8, wherein elements of a peripheral circuit are mounted on one printed circuit board.

10. An image sensing device as claimed in claim 8, wherein a peripheral circuit comprises a light receiving element driver and a signal processor.

11. An image sensing device as claimed in claim 8, wherein said lens fitting member fitting hole is an engagement groove and an end opposite to a lens fitted on said lens fitting member is engaged and fixed therein.

12. An image sensing device as claimed in claim 8, wherein said lens fitting member is formed in a lens-barrel shape.

13. An image sensing device as claimed in claim 8, wherein said light receiving element is a solid-state image sensing element.

14. An image sensing device as claimed in claim 13, wherein one or more locating projections are formed on an inner or outer surface of an end opposite to a lens on said lens fitting member, and one or more locating recesses for engaging with said locating projections are formed on an inner or outer surface of said engagement groove.

* * * * *